US006262593B1

(12) United States Patent
Sobelman et al.

(10) Patent No.: US 6,262,593 B1
(45) Date of Patent: *Jul. 17, 2001

(54) SEMI-DYNAMIC AND DYNAMIC THRESHOLD GATES WITH MODIFIED PULL-UP STRUCTURES

(75) Inventors: Gerald Edward Sobelman, Minnetonka; Jason J. Hinze, Minneapolis, both of MN (US)

(73) Assignee: Theseus Logic, Inc., Orlando, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,335

(22) Filed: Jan. 8, 1998

(51) Int. Cl.[7] .................................................. H03K 19/23
(52) U.S. Cl. .............................. 326/35; 326/119; 326/121
(58) Field of Search ................................ 326/93, 95, 98, 326/112, 119, 21, 35; 327/205, 206

(56) References Cited

U.S. PATENT DOCUMENTS

| | | |
|---|---|---|
| 3,715,603 | 2/1973 | Lerch . |
| 4,845,633 | 7/1989 | Furtek . |
| 5,025,178 * | 6/1991 | Nunally ................... 326/121 |
| 5,121,003 | 6/1992 | Williams . |
| 5,382,844 | 1/1995 | Knauer . |
| 5,640,105 * | 6/1997 | Sobelman et al. ............ 326/36 |
| 5,831,452 * | 11/1998 | Nowak et al. ............... 326/98 |

FOREIGN PATENT DOCUMENTS

| | | |
|---|---|---|
| 0566739 A1 | 10/1993 | (EP) . |
| 0570584 A1 | 11/1993 | (EP) . |
| 0578821 A1 | 1/1994 | (EP) . |
| WO92/12498 | 7/1992 | (WO) . |
| WO92/16971 | 10/1992 | (WO) . |
| WO94/03929 | 2/1994 | (WO) . |

OTHER PUBLICATIONS

M.R. Greenstreet, T.E. Williams, and J. Staunstrup, Self–Timed Iteration, Elsevier Science Publishers B.V. (North–Holland), IFIP, 1988, pp. 309–322.

Teresa H.–Y. Meng, Robert W. Brodersen, and David G. Messerschmitt. Automatic Synthesis of Asynchronous Circuits from High–Level Specifications, IEEE Transactions on Computer–Aided Design, vol. 8, No. 11, 11/1989, pp. 1185–12.

Ted Williams, Latency and Throughput Tradeoffs in Self–Timed Speed–Independent Pipelines and Rings, Stanford University Technical Report No. CSL–TR–90–431, 8/1990.

(List continued on next page.)

*Primary Examiner*—Michael Tokar
*Assistant Examiner*—Anh Tran
(74) *Attorney, Agent, or Firm*—Steptoe & Johnson LLP

(57) ABSTRACT

An m-of-n threshold gate is disclosed having an output stated derived from the voltage of a signal node. A "Go-to-Data" circuit pulls the signal node to a first state, corresponding to an ASSERTED (logically meaningful) output when a threshold number of inputs is in the ASSERTED state. A "Go-to-NULL" circuit pulls the signal node to a second state, corresponding to a NULL (logically meaningless) output when all inputs are in the NULL state. In a semi-dynamic embodiment, a weak feedback transistor holds the signal node in a predetermined state when some, but less than the threshold number of inputs is ASSERTED. In a dynamic embodiment, the signal node becomes isolated when less than the threshold number of inputs is ASSERTED, but holds sufficient charge to maintain the signal node in a state that existed at the time of isolation. A variety of GTN circuits are disclosed. Gates can be modified for the NULL state to be represented as ground (non-inverted) or other reference voltage (inverted). Alternating stages of inverted and non-inverted circuits can be used.

16 Claims, 7 Drawing Sheets

OTHER PUBLICATIONS

Jens Sparso and Jorgen Staunstrup, Delay–insensitive multi–ring structures, INTEGRATION, the VLSI Journal 15, 1993, Elsevier Science Publishers B.V., PP. 313–340.

Tzyh–Yung Wuu and Sarma B.K. Vrudhula, A Design of a Fast and Area Efficient Multi–Input Muller C–element, IEEE Transactions on VLSI Systems, vol. 1, No. 2, Jun. 1993, pp. 215–219.

Marc Renaudin and Bachar El Hassan, The Design of Fast Asynchronous Adder Structures and Their Implementation Using D.C.V.S. Logic, Int'l. Symposium on Circuits & Systems, vol. 4, 1994. pp. 291–294.

Richard B. Burford, Xingcha Fan and Neil W. Bergmann, An 180 Mhz 16 bit Multiplier Using Asynchronous Logic Design Techniques, IEEE 1994 Custom Integrated Circuits Conference pp. 215–218.

Ted Williams, Self–Timed Rings and Their Application to Division, Stanford University Technical Report No. CSL–TR–91–482, May 1991.

Stephen H. Unger, Asynchronous Sequential Switching Circuits, 1969, pp. 221–229.

Carver Mead & Lynn Conway, Introduction to VLSI Systems, 1980, pp. 242–262.

Ivan E. Sutherland, Micropipelines, Communications of the ACM, 12/1989, vol. 32, No. 6.

Hampel et al., Threshold Logic, IEEE Spectrum, 5/1971, pp. 32–39.

Brzozowski et al., Asynchronous Circuits –Monographs in Computer Science, Springer–Verlag New York, Inc., 1995, New York, NY.

E. Brunvand, The NSR Processor, Department of Computer Science, University of Utah IEEE, 0–8186–1060–3425/93, 1993.

Lars S. Nielsen & Jens Sparso, A Low–power Asynchronous Data–patch for a FIR filter bank, IEEE, 0–8186–7298–6/96.

* cited by examiner

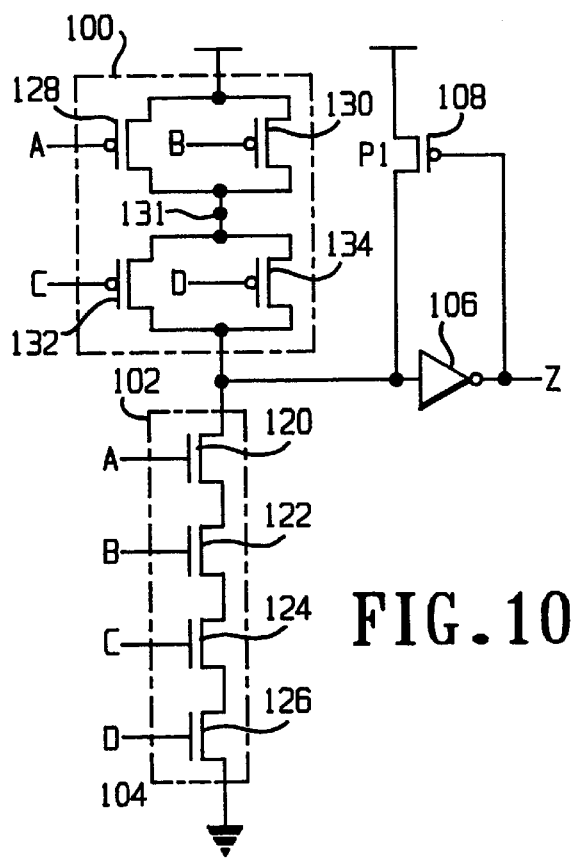
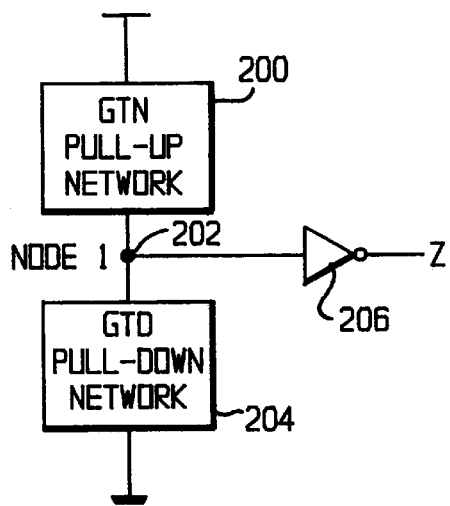
FIG.10
FIG.11
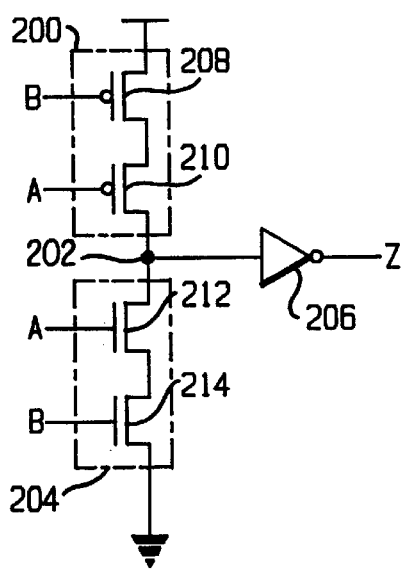
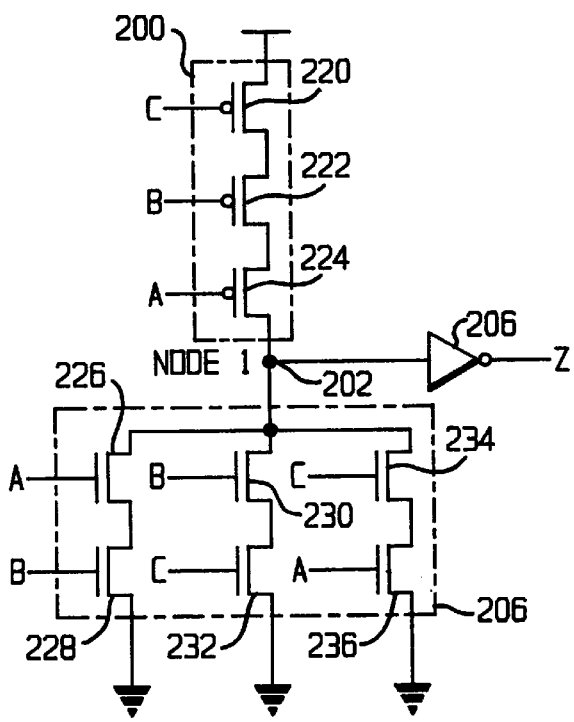
FIG.12
FIG.13

US 6,262,593 B1

SEMI-DYNAMIC AND DYNAMIC THRESHOLD GATES WITH MODIFIED PULL-UP STRUCTURES

FIELD OF THE INVENTION

The invention relates to the field of electronic circuits, and more particularly to threshold logic circuits for arithmetic, logic, and signal processing.

BACKGROUND

Most previous logic systems, such as Boolean logic systems, have employed clocking signals to regulate the sequential processing of binary logic signals. In traditional Boolean logic that uses a CMOS or TTL implementation, a low voltage level on a signal line means "logic false" or the number "zero." A high voltage level on the same line means "logic true" or the number "one." Thus a signal line may assume one of two values, either of which ostensibly has meaning.

Typically, a sequential logic circuit will respond to a grouped set of inputs to generate an output. While a set of input signals propagates through the sequential circuit, the sequential circuit output is unreliable for a period of time corresponding to worst-case propagation delays through the individual logic gates. In traditional clocked Boolean logic circuits, however, a binary signal might—or might not—be valid at any given moment. Outputs of combinational circuits have a period of uncertainty during which input signals propagate through gates. Designers accommodate such periods of instability by analyzing the worst-case propagation delays through such circuits and sampling the signal only at predetermined times when the output is expected to be stable, often by latching the output into a register. The sampling time is determined by an independent clock signal, i.e., one that is not derived from the states of the logic gates themselves.

While these traditional synchronous circuits have become the dominant class of logic, a substantial amount of design analysis is necessary to avoid a variety of timing-related problems, such as worst-case propagation delay and race conditions. In addition, the proportion of power and wafer area ("real estate") that must be devoted to clocking has become substantial, and in certain instances can be a limiting factor to the total amount of functionality that can be integrated onto a single chip.

SUMMARY

An object of the invention is to provide threshold gates for use in asynchronous circuits.

A further object of the invention is to provide threshold gates using a semi-dynamic transistor design.

A further object of the invention is to provide threshold gates using dynamic transistor design.

A further object of the invention is to provide threshold gates adapted for receiving inputs on signal lines grouped into mutually exclusive assertion groups.

A further object of the invention is to provide asynchronous circuits from interconnected threshold gates.

A further object of the invention is to provide gates capable of operating with NULL signal states that have no arithmetic or logic meaning.

A further object of the invention is to provide gates capable of operating with the NULL state assigned to a high or low voltage state.

A further object of the invention is to provide staged circuits, where the NULL state may be assigned different voltage states in different stages.

These and other objects are achieved by providing threshold gate designs. In the preferred embodiments, threshold gates have output signals which switch between two states: ASSERTED and NULL. The ASSERTED state is assigned an arithmetic or logic meaning. The NULL state has no arithmetic or logic meaning. The NULL state may be assigned as a voltage level near the voltage of a voltage reference, such as a power source, or a voltage level near ground. Gate designs may be semi-dynamic or dynamic.

Certain designs are especially adapted for processing signals grouped into mutually exclusive assertion groups. In a mutually exclusive assertion group, at most one signal line will be ASSERTED at time.

BRIEF DESCRIPTION OF THE DRAWING FIGURES

The present invention will be described below with reference to the attached drawings in which:

FIG. 10 illustrates a semi-dynamic two-of-four gate using inverted logic adapted for two mutually exclusive assertion groups each having two lines;

FIG. 11 illustrates a block diagram for a dynamic threshold gate;

FIG. 12 shows a schematic diagram of a dynamic two-of-two threshold gate;

FIG. 13 illustrates a dynamic two-of-three threshold gate;

DETAILED DESCRIPTION OF THE PREFERRED EMBODIMENTS

Figure 1:
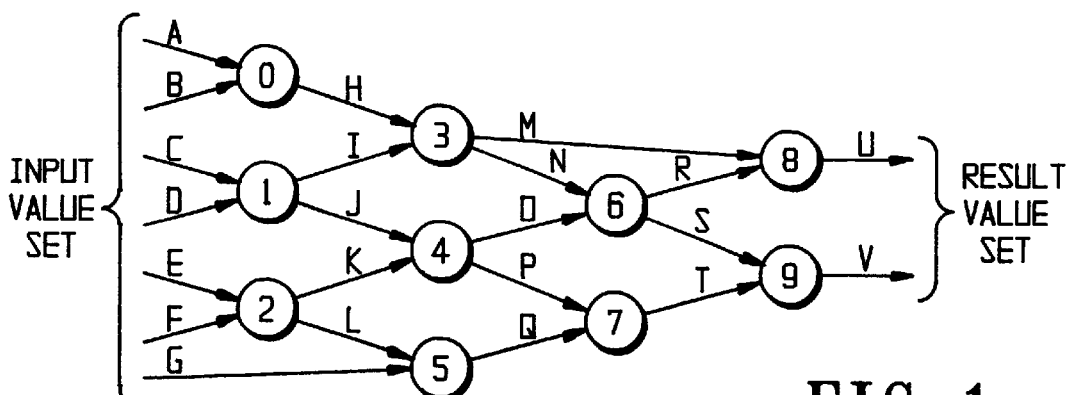
FIG. 1 illustrates a combinational circuit.

Asynchronous circuits have been proposed that are intended to operate without an independent clock. One asynchronous logic paradigm is disclosed in U.S. Pat. No. 5,305,463 ("NULL Convention Logic"), which is incorporated herein by reference in its entirety. This paradigm uses logic gates referred to as threshold gates. Circuits are made with gates having varying numbers of inputs and threshold values. Further information about such circuits can be found in U.S. Pat. No. 5,656,948, which is incorporated herein by reference in its entirety.

Circuits described in U.S. Pat. Nos. 5,305,463 and 5,656,948 (referred to hereafter as NULL Convention circuits) generate a result value set in response to an input value set. An important aspect of those circuits is that any particular input signal may have a meaningful logic or arithmetic value or a NULL value which has no logic or arithmetic meaning. The very presence of a meaningful value indicates that the signal has meaning, and no external clock is required to indicate that a meaningful value is meaningful.

NULL convention logic signals as described in U.S. Pat. Nos. 5,365,463 and 5,656,948 have multiple implementations which include a NULL state that has no logical or arithmetic meaning. In one implementation, two physical signal lines would be used to convey two meaningful values. For example, logic "false" would be conveyed by asserting a low voltage on the first physical line and a high voltage on the second physical line. Logic "true" would be conveyed by asserting a low voltage on the first physical signal line and a high voltage on the second physical signal line. NULL would be conveyed by low voltage levels on both physical signal lines. (High voltage levels on both physical signal lines is an unused combination.) A high voltage on a physical signal line is assigned a state referred to as "ASSERTED." Meaning is expressed according to the physical signal line being ASSERTED, not by the choice of voltage level. A low voltage level is not assigned a logic meaning, and is assigned a state called "NULL." Alternatively, ASSERTED meaning can be assigned to the ground voltage state, while a high voltage state has no logic meaning. Other mappings of ASSERTED and NULL logical states to physical states are also possible.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the ground voltage level is NULL. In other implementations, parameters other than voltage may be used as long as the requisite number of states can be differentiated. Discussions here will assume an implementation in which each signal line may assume two voltage levels, one being the voltage of a reference voltage, such as a power source, and the other being the ground voltage level. This provides voltage levels as concrete examples to aid in explanation, but the invention is not limited to these specific voltage-level examples.

Another important aspect of NULL convention circuits is the way that meaningful and NULL signals propagate through a combinational circuit. All inputs to a NULL convention logic element (such as an individual gate or a larger circuit) must be meaningful before the element asserts a meaningful output. FIG. 1 illustrates a NULL convention combinational circuit. In FIG. 1, logic gates are shown as circles and labeled with numerals 0–9. Input signals are labeled with letters A–G, output signals are labeled with letters U,V, and internal connection signals are labeled with letters H–T. Signals are schematic, and may be individual conductors, multiple conductors or another NULL convention signal format.

In a NULL convention circuit, a gate output signal transitions from a NULL value to a meaningful value after all input signals have assumed meaningful values. For example, as illustrated in FIG. 1, assume that input signals A and B initially have NULL values, and logic gate zero (0) initially has a NULL output. In the case that only input signal A transitions to a meaningful value (while input signal B remains at NULL), logic gate zero (0) will maintain a NULL output. In the case that only input signal B transitions to a meaningful value (while input line A remains at NULL), logic gate zero (0) still will maintain a NULL output. When both input signals A and B transition to meaningful values, then logic gate zero (0) will change its output to a meaningful value.

The characteristic described above applies to all logic gates in the sequential circuit. Logic gates zero (0) through two (2), which are directly connected to input lines, will provide meaningful values to the next level of gates (three through five) only when the respective inputs have completely assumed meaningful values. This produces a general result that can be visualized as a wavefront of meaningful values propagating through the network. At the network output, logic gates eight and nine will change their individual outputs from NULL to meaningful values only when all upstream gates have propagated meaningful values.

Two important characteristics should now be apparent. First, the network outputs transition from NULL to meaningful values cleanly. That is, the outputs do not switch back and forth while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, complete, and may be used by downstream circuitry. Thus, no external clock is required to indicate that the network has completed its operations.

In one implementation, the NULL convention logic gates discussed here also exhibit a second characteristic: their outputs transition from a meaningful value to NULL only when all inputs have switched to NULL. In this way, NULL values propagate through the network cleanly, and the very presence of NULL values at the output is sufficient to indicate that all gate outputs in the network have returned to NULL.

Figure 2A:
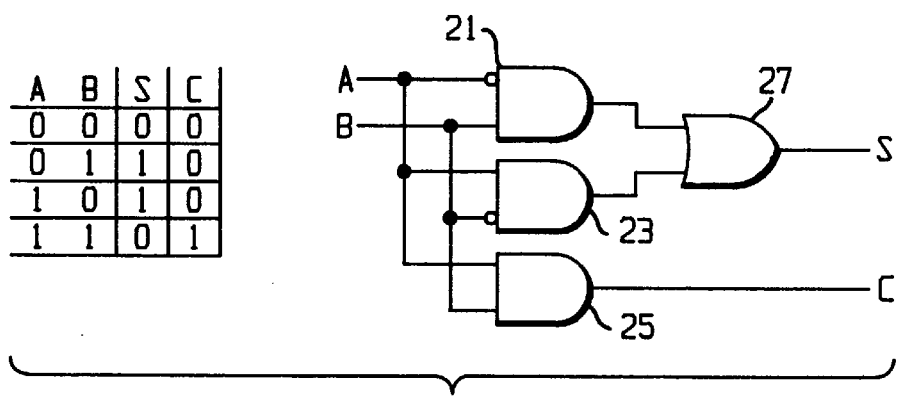
FIG. 2a illustrates a Boolean half-adder constructed of three AND gates and an OR gate.

FIG. 2a illustrates a Boolean half-adder constructed of three AND gates 21, 23, 25 and an OR gate 27. The half adder has two input signal lines A and B, and two output lines S (sum) and C (carry). Each input line may assume one of two states that have arithmetic meaning: "zero" and "one." Each output line may assume one of two states that have arithmetic meaning: "zero" and "one." The half adder implements a transfer function such that:
  i) when both inputs are zero, sum (S) and carry (C) outputs are "zero;"
  ii) when a single input is "one" (and the other is "zero"), sum is "one" and carry is "zero;" and
  iii) when both inputs are "one," sum is "zero" and carry is "one."

Figure 2B:
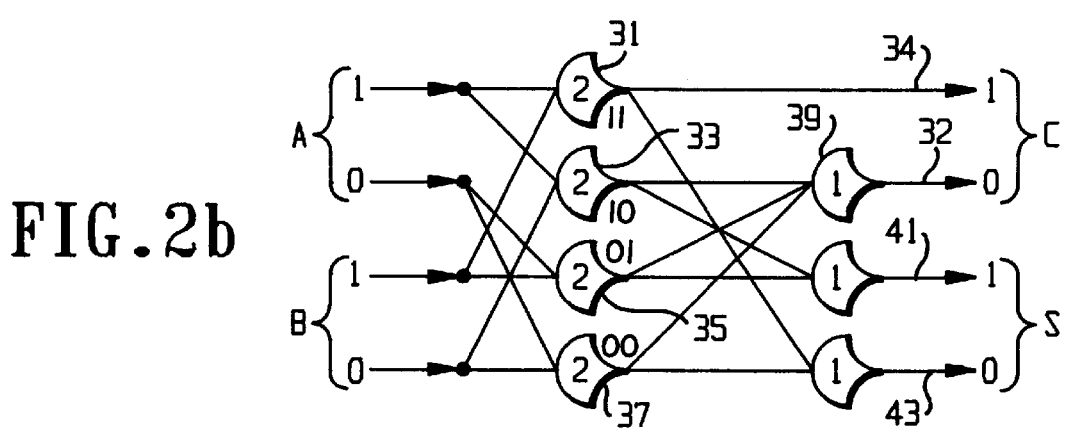
FIG. 2b illustrates a "two-wire" NULL convention half adder.

For illustration and comparison, FIG. 2b illustrates a "two-wire" NULL convention half adder. It is similar to the boolean half-adder of FIG. 2a in that there are two inputs A and B and two outputs S and C, and it implements the same arithmetic transfer function. Unlike the Boolean circuit, the NULL convention half-adder has a separate physical signal line for each arithmetic meaning. The carry output, for example, has two separate physical signal lines, each of which may assume one of two voltage levels. A first voltage level is meaningful and the other voltage level is NULL. In order to assert a meaning of "carry equals zero," the first signal line 32 (designated as having a meaning "zero" when ASSERTED) is driven to its ASSERTED voltage level, while the second signal line is held at the NULL voltage level. In order to assert a meaning "carry equals one," the first signal line is held at the NULL voltage level, while the second signal line 34 (designated as having a meaning "one" when ASSERTED) is driven to the ASSERTED voltage level. The half-adder can also assume a state "carry has no meaning" by holding both carry signal lines at the NULL voltage. It is not permitted to have both carry lines at the meaningful voltage level simultaneously. Similarly, the remaining input and output signals (A, B, S) each have a pair of physical signal lines.

Hereafter, when a circuit switches a signal to a meaningful logic or arithmetic value, it will be said that the circuit "asserts" the signal, or that the signal is "ASSERTED." When a circuit switches a signal to a NULL value, the signal will be said to be NULL. Similarly, a physical signal line will be said to be "ASSERTED" or "NULL" depending on its state.

The two carry lines 32, 34 form a group of signal lines in which at most one line may be ASSERTED (i.e., assume a meaningful value). Such a group is referred to as a "mutually exclusive assertion group." In other design situations, mutually exclusive assertion groups may have more than two lines. A single signal line, by itself, can be considered a mutually exclusive assertion group if its associated signal has only one meaningful value.

Internally, the NULL convention half adder is made of seven threshold gates 31, 33, 35, 37, 39, 41, 43. Each threshold gate has a single signal line output which may be ASSERTED (assume a meaningful voltage level) or NULL (assume a NULL voltage level). A gate output signal line may fan out to several destinations. Four of the gates 31, 33, 35, 37 have two input signal lines and a threshold of two ("threshold-two gate" or "2-of-2" gate). The output of a threshold-two gate is ASSERTED when two (both) of the input lines are ASSERTED. One of the gates 39 has three input signal lines and threshold of one ("threshold-one gate"). The output of the threshold-one gate is ASSERTED when any one of the three inputs is ASSERTED. Two of the gates 41, 43 have two inputs and a threshold of one. As a drawing convention, a numeral inside a threshold gate symbol indicates the number of ASSERTED input lines needed to cause the gate to assert its output.

Each of the gates of the NULL convention half adder exhibits the characteristic that it switches to a meaningful value only when the requisite number of inputs becomes meaningful. In one NULL convention implementation, each threshold gate holds a meaningful output value until all of the inputs become NULL. Thus, threshold gates exhibit a hysteresis: as the number of inputs drops below the threshold, the output remains meaningful. For example, the threshold-two gates 31, 33, 35, 37 will maintain meaningful output levels when the number of meaningful inputs drops from two to one. The threshold-two gates will switch to NULL when all inputs become NULL.

It should be appreciated that a threshold gate forms a central building block of NULL convention logic circuits. The NULL convention threshold gates may be characterized by the number of inputs and the threshold value. NULL convention threshold gates also have the unique operational requirement that some or all inputs will form mutually exclusive assertion groups. They further ensure completeness of the input set, in that they switch to a meaningful output value only when all input signals are meaningful.

Figure 3A:
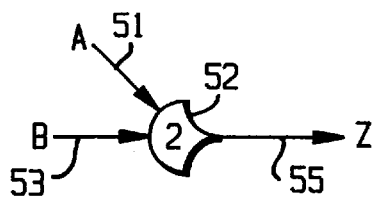
FIG. 3a illustrates a symbol for a two-input, threshold-two (two-of-two) gate having inputs A and B and output Z.

FIG. 3a illustrates a symbol 52 for a two-input, threshold-two (two-of-two) gate having inputs A and B and output Z. Here, each input line 51, 53 and the output line 55 each represent one physical signal line which is capable of assuming a meaningful value or NULL. When both input signals A, B are ASSERTED, the output Z is ASSERTED. After the output has been ASSERTED, the output returns to NULL when both inputs A, B return to NULL.

Figure 3B:
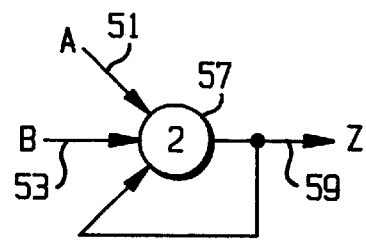
FIG. 3b illustrates a symbol for a three-input majority-function gate having two inputs A and B and an output Z.

FIG. 3b illustrates a symbol 57 for a three-input majority-function gate having two inputs A and B and an output Z as in FIG. 3a. The output line 59 is fed back as an input, which conceptually provides the functionality of the two-of-two NULL convention threshold gate of FIG. 3a. In isolation (i.e., without the feedback signal), the majority-function gate operates without hysteresis. When the number of ASSERTED inputs is greater than two, the majority function gate output is ASSERTED. When the number of ASSERTED inputs is less than two, the majority function gate output goes NULL.

With feedback, the majority-function gate has hysteresis. When the output Z is ASSERTED, the feedback line provides one ASSERTED input. If the number of ASSERTED inputs drops to one, then the feedback line provides a second ASSERTED input to hold the majority function gate to an ASSERTED output. The output Z will switch to NULL only when both independent inputs A and B become null. Conversely, when the output Z is NULL, the feedback line provides one NULL input. The output Z will be ASSERTED only when both independent inputs A and B are ASSERTED.

Figure 3C:
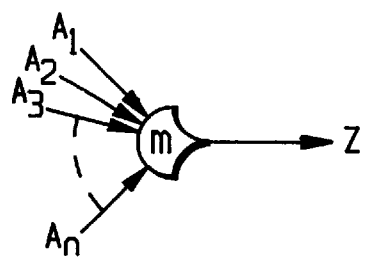
FIG. 3c depicts the symbol for an n-input, threshold-m (m-of-n) logic gate, having inputs A1 through An and output Z.

Although FIG. 3a specifically illustrates a two-of-two logic gate, it should be understood that similar gates can be configured having any number of desired input lines and threshold values. FIG. 3c depicts the symbol for an n-input, threshold-m (m-of-n) threshold gate, having inputs A1 through An and output Z, where m and n are integers, and m may be less than or equal to n. In this case, output Z is ASSERTED when m of the n input lines are ASSERTED. After the output has been ASSERTED, the output Z returns to NULL when all input lines Al through An return to NULL.

Figure 3D:
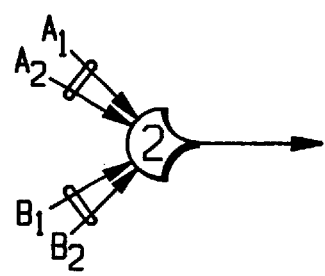
FIG. 3d illustrates a threshold-2 gate having two Mutually Exclusive Assertion Groups (MEAGs)

FIG. 3d illustrates a threshold-2 gate receiving two Mutually Exclusive Assertion Groups (MEAGs). The first MEAG has inputs A1 and A2; the second has inputs B1 and B2. In the first MEAG, only one of the two input lines A1, A2 will be in an ASSERTED state at a time. Similarly, in the second MEAG, only one of the two inputs B1, B2 will be in an ASSERTED state at a time. In this example, the Data wavefront will be complete when one input of the first MEAG and one input of the second MEAG assert Data. The NULL wavefront will be complete when all inputs are NULL.

Semi-Dynamic Threshold Gates

Figure 4:
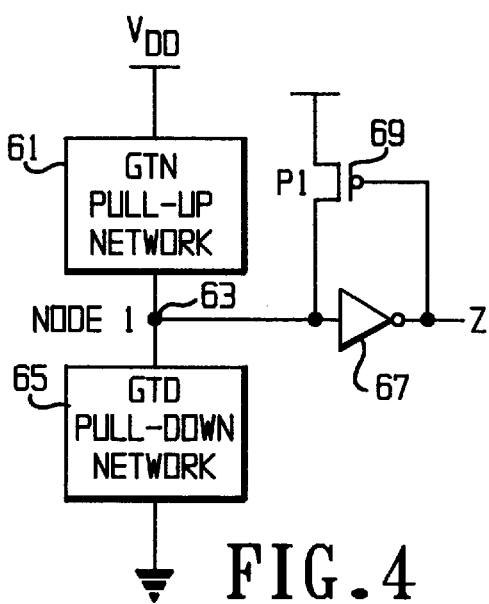
FIG. 4 is a generic block diagram of a "semi-dynamic" threshold logic gate.

FIG. 4 is a block diagram of a "semi-dynamic" threshold gate. The semi-dynamic threshold gate includes two transistor networks: (i) a "Go-to-NULL" (GTN) pull-up network 61 comprising PMOS transistors that receive the inputs A1, ..., An and, when ON, establish a connection between a signal node 63 and VDD; and (ii) a "Go-to-Data" (GTD) pull-down network 65 comprising NMOS transistors that receive the inputs A1, ..., An and, when ON, establish a connection between the signal node 63 and ground. The semi-dynamic threshold gate of FIG. 4 also includes: (iii) a static CMOS inverter 67 that drives the output Z; and (iv) a weak PMOS transistor 69 that, when ON, maintains the node 63 at VDD.

When the GTN pull-up network 61 and the GTD pull-down network 65 are both OFF, the weak p-MOS transistor 69 determines the voltage level at the signal node 63. If the signal node 63 is at VDD (because the GTN pull-up network 61 had previously been ON), then the transistor 69 will be ON and will maintain the node 63 at VDD indefinitely.

If the signal node 63 is at ground because the GTD pull-down network had previously been ON, then the transistor 69 will be OFF, the signal node 63 will be isolated and remain at ground, thereby maintaining the output high. The weak PMOS transistor 69 is said to be "weak" in the sense that, when both it and the GTD Pull-Down Network 65 are ON, the GTD Pull-Down Network 65 provides a stronger pull-down action than the weak PMOS transistor's pull-up action. The GTD Pull-Down Network 65 "wins," and drives the voltage at signal node 63 below the switching threshold of the inverter 67.

The GTN network 61 and GTD network 65 can be adapted to receive varying input signals A1, ..., An, and to switch upon predetermined combinations of ASSERTED inputs. In this way, the generic, semi-dynamic structure depicted in FIG. 4 can be adapted to achieve a family of gates having varying numbers of inputs, varying thresholds, and varying switching characteristics. The GTN and GTD networks can be adapted with "Flash" and "Set" functions as described in copending U.S. patent application Ser. No. 09/004,336, filed on even date herewith by G. Sobelman, entitled "Null Convention Logic Gates With Flash and Set Capability" (incorporated herein by reference.)

Figure 5:
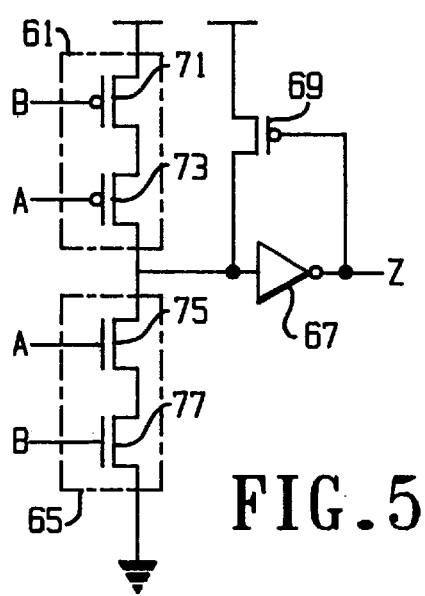
FIG. 5 is a transistor-level schematic diagram of a two-of-two semi-dynamic threshold gate of the generic structure shown in block diagram form in FIG. 4.

FIG. 5 depicts a transistor-level diagram of a two-of-two semi-dynamic threshold gate of the generic structure shown in block diagram form in FIG. 4. A pair of first and second PMOS transistors 71 and 73 connect in series between VDD and signal node 63 to form the GTN pull-up network 61. The first PMOS transistor 71 receives input signal B as a gate input, while the second PMOS transistor 73 receives input signal A as a gate input. A second series pair of first and second NMOS transistors 75 and 77 connect in series between the signal node 63 and ground to form the GTD pull-down network 65. The first NMOS transistor 75 receives input signal A as a gate input, while the second NMOS transistor 77 receives input signal B as a gate input. A weak p-MOS transistor 69 and inverter 67 are connected as shown in FIG. 4.

When both inputs signals A, B are at a high voltage level (ASSERTED), the NMOS transistors 75, 77 of the GTD pull-down network 65 are ON, and the PMOS transistors 71, 73 of the GTN pull-up network 61 are OFF. The voltage at the signal node 63 is at (or close to) ground, and the inverter 67 drives the output Z to a high voltage (ASSERTED). When both inputs signals A, B are at (or close to) the ground voltage level (NULL), the PMOS transistors 71, 73 of the GTN pull-up network 61 are ON, and the NMOS transistors 71, 75 of the GTD pull-down network 65 are OFF. The voltage at the signal node 63 is close to VDD, and the inverter 67 drives the output Z to a low voltage (NULL). If one of the two inputs A, B, is low (NULL) while the other is high (ASSERTED), one transistor is OFF in each of the GTN pull-up network 61 and GTD pull-down network 65. Under this circumstance, the weak PMOS transistor 69 determines the voltage at the signal node 63 (and thus the output). If the output Z was previously low (NULL), the weak PMOS transistor 69 will be ON and will hold the signal node at a high voltage, and the inverter 67 will hold the output at NULL. If the output Z was previously high (ASSERTED), weak PMOS transistor will be OFF. The signal node 69 will be isolated, and will retain its previous low state, which also holds the output high (ASSERTED). Thus, the gate will: (1) switch the output to NULL when the threshold number (two) of the inputs are NULL; (2) switch the output to ASSERTED when all (two) inputs are ASSERTED; and (3) hold the output in a prior NULL or ASSERTED state as long as at least one input remains ASSERTED, even if the number of ASSERTED inputs is less than the threshold number.

Figure 6:
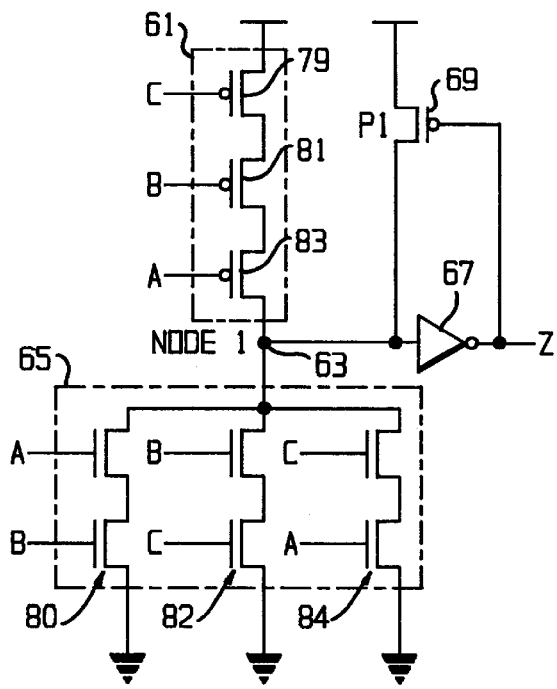
FIG. 6 illustrates a two-of-three semi-dynamic threshold gate.

FIG. 6 illustrates a 2-of-3 semi-dynamic threshold gate. The GTN pull-up network 61 comprises three PMOS transistors 79, 81, 83 connected in series between VDD and the signal node 63. The gates of the three PMOS transistors each connect to one of the three inputs A, B, C. The GTD pull-down network 65 comprises three pair of NMOS transistors 80, 82, 84. Each pair connects in series between the signal node 63 and ground. Gates of the first pair of NMOS transistors 80 connect to inputs A and B. Gates of the second pair of NMOS transistors 82 connect to inputs B and C. Gates of the third pair of NMOS transistors 84 connect to inputs A and C.

When any combination of two or more inputs is high (ASSERTED), the GTD pull-down network 65 pulls the voltage of signal node 63 to ground, and the inverter 67 produces a high voltage signal (ASSERTED) at the output Z. When all inputs A, B, C are low, the GTN pull-up network 61 pulls the voltage of signal node 63 to VDD, and the inverter 67 produces a low voltage signal (NULL) at the output.

When precisely one of the inputs A, B, C is high, the GTD and GTN networks are off, and the weak PMOS transistor 69 determines the voltage at the signal node 63. If the output Z was previously low (NULL), the weak PMOS transistor 69 will be ON and hold the signal node at a high voltage. The inverter 67 will hold the output low (NULL). If the output Z was previously high, the weak PMOS transistor 69 will be OFF. The signal node 69 will be isolated, and will retain its previous low state, which holds the output high (ASSERTED). Thus, the gate will: (1) switch the output to low (NULL) when all inputs are low (NULL); (2) switch the output to high (ASSERTED) when at least two inputs are high (ASSERTED); and (3) hold the output in a prior NULL or ASSERTED state when one (i.e., less than the threshold number) of the inputs remains ASSERTED.

The configuration illustrated in FIG. 6 of inputs to the GTD pull-down network 65 minimizes undesirable charge-sharing effects between the various NMOS transistors. It should be noted that in actually constructing the circuit shown in the figure, these charge-sharing effects can be further minimized by implementing the circuit with minimum-sized shared diffusion regions between adjacent transistors within each series chain of transistors in both the GTN pull-up network 61 and the GTD pull-down network 65.

In light of the examples shown above, it will be appreciated that additional semi-dynamic gates can be formed using the general structure of FIG. 4. The pull-up and pull-down networks can be varied to produce gates with a variety of numbers of input signal lines, such as three-input, four-input, five-input, etc. For a given number of input signal lines, thresholds can be varied so as to produce a variety of gates, e.g., a 1-of-5, 2-of-5, 3-of-5, etc.

Figure 7:
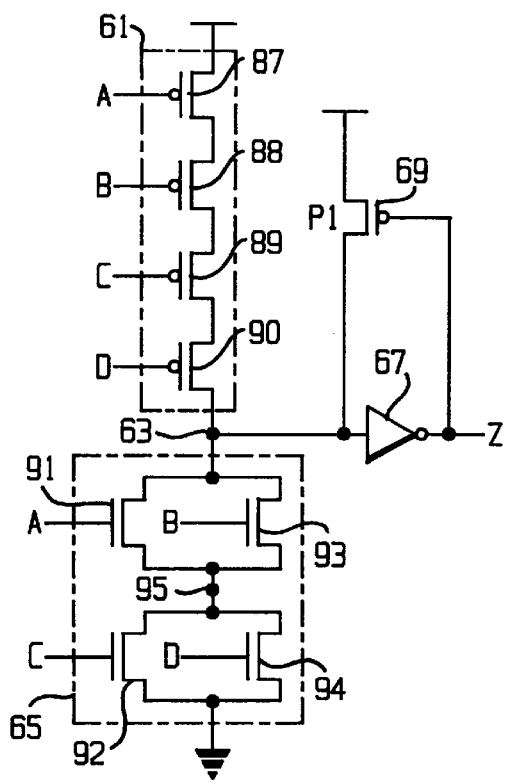
FIG. 7 illustrates a semi-dynamic two-of-four threshold gate adapted for two mutually exclusive assertion groups of two signal lines each.

Threshold gates can be further adapted to reflect input signals lines that form mutually exclusive assertion groups. FIG. 7 illustrates a semi-dynamic two-of-four threshold gate adapted for two mutually exclusive assertion groups of two signal lines each. The GTN pull-up network 61 comprises four PMOS transistors 87, 88, 89, 90 connected in series between VDD and signal node 63. The gates of the four PMOS transistors each connect to one of the four inputs A, B, C, D. The GTD pull-down network 65 comprises two pairs of NMOS transistors. The first pair 91, 93 connect in parallel between the signal node 63 and an internal node 95. The second pair of NMOS transistors 92, 94 connect in parallel between the internal node 95 and ground. Gates of the first pair of NMOS transistors 91, 93 connect to inputs A and B. Gates of the second pair of NMOS transistors 92, 94 connect to inputs C and D.

In this example, signal lines A and B form a first mutually exclusive assertion group, and signal lines C and D form a second mutually exclusive assertion group. Only one of signal lines A and B will be ASSERTED at a time, and only one of input signal lines C and D will be ASSERTED at time. When a signal line from the first mutually exclusive assertion group and a signal line from the second mutually exclusive assertion group are high (ASSERTED), corresponding transistors of the GTD pull-down network 85 form a conduction path pulling the voltage of signal node 63 to ground, and the inverter 67 produces a high (ASSERTED) voltage signal at the output Z. When all inputs A, B, C, D are low (NULL), the GTN pull-up network 61 pulls the voltage of signal node 63 to VDD, and the inverter 67 produces a low (NULL) voltage signal at the output.

When precisely one of the inputs A, B, C, D is high (ASSERTED), the GTD and GTN networks are off, and the weak PMOS transistor 69 determines the voltage at the signal node 63. If the output Z was previously low, the weak PMOS transistor 69 will be ON and hold the signal node 63 at a high voltage. The inverter 67 will hold the output low (NULL). If the output Z was previously high (ASSERTED), the weak PMOS transistor 69 will be OFF. The signal node 69 will be isolated, and will retain its previous low state, which holds the output high (ASSERTED). Thus, the gate will: (1) switch the output to low (NULL) when all inputs are low (NULL); (2) switch the output to high (ASSERTED) when at least one signal line from each mutually exclusive assertion group is asserted; and (3) hold the output in a prior NULL or ASSERTED state when one input is ASSERTED.

In the implementations discussed above, NULL values are assigned to a low voltage level (ground), while ASSERTED values are assigned a high voltage level (VDD). Threshold gates can also be implemented in alternate configurations, referred to here as "inverted logic" configurations, where NULL is assigned to a high voltage level, and ASSERTED is assigned to a low voltage level.

Figure 8:
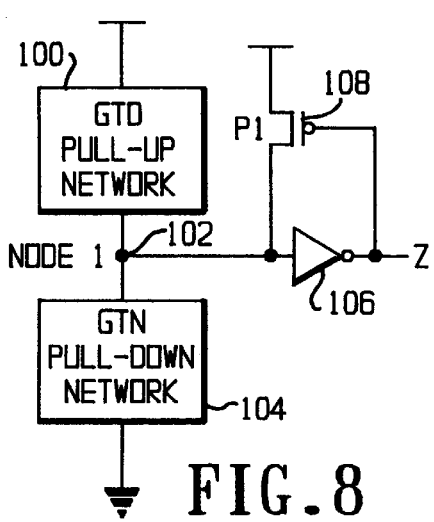
FIG. 8 shows a block diagram of a semi-dynamic threshold gate adapted for inverted logic.

FIG. 8 shows a block diagram of a semi-dynamic threshold gate adapted for inverted logic. The gate includes: (1) a GTD pull-up network 100 comprising PMOS transistors that, when ON, establish a connection between signal node 102 and VDD; (2) a GTN pull-down network 104 comprising NMOS transistors that, when ON, establish a connection between signal node 102 and ground; static CMOS inverter 106 that drives an output Z as the inverse voltage of the signal node 102; and weak PMOS transistor 108 that connects the signal node 102 to VDD in response to the output Z. The primary difference between the inverted gate of FIG. 8 and the non-inverted gate of FIG. 4 is that the GTN and GTD networks 100, 104 pull the signal node to VDD or ground under different logic conditions. In general, an inverted gate can be designed from a non-inverted gate by replacing PMOS devices in the GTN and GTD networks of the non-inverted gate with NMOS devices (and vice versa), and reversing the power and ground connections to those networks.

A threshold gate configured according to inverted logic operates in the following fashion for a generalized m-of-n threshold gate. When all of the input signals go high (NULL), the GTN pull-down network 104 turns ON, while the GTD pull-up network 100 remains OFF, thereby pulling signal node 102 to ground, and driving output Z to high (NULL). When a number of inputs becomes low (ASSERTED), the GTD pull-up network 100 turns ON while the GTN pull-down network 104 remains OFF, thereby pulling signal node 102 to VDD, and driving output Z low (ASSERTED). When at least one, but less than the threshold number of inputs is low (ASSERTED), both the GTN pull-down network 104 and the GTD pull-up network 100 are OFF, so that node 102 remains isolated except for the action of the weak PMOS transistor 102. The weak PMOS transistor arrangement will pull the signal node 102 high when the output Z was previously low (ASSERTED), thereby maintaining an ASSERTED output until all inputs are NULL. If the output Z was previously high (NULL), the weak PMOS transistor will be off, which isolates the signal node 102 and leaves it in its prior state (low) until the threshold number of inputs becomes ASSERTED. The weak PMOS transistor 108 is "weak" in the sense that, when both it and the GTN pull-down network 104 are ON, the GTN pull-down network provides a stronger pull-down action than the weak PMOS transistor's pull-up action. The GTN pull-down network 104 "wins," and drives the voltage at node 102 below the switching threshold of the inverter 106.

Figure 9:
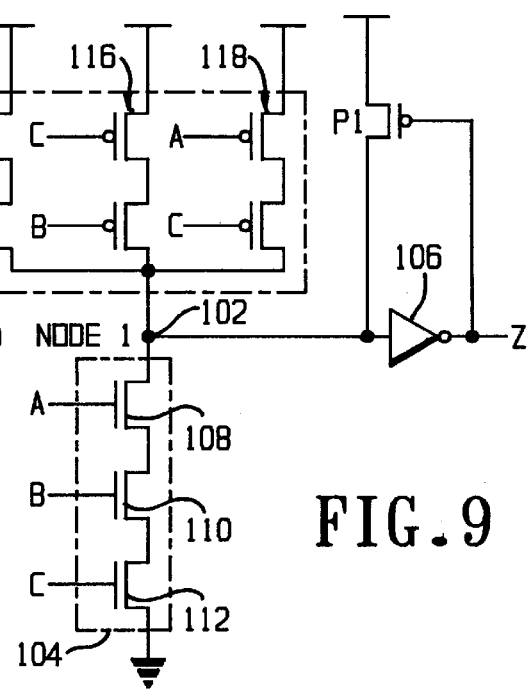
FIG. 9 illustrates a two-of-three semi-dynamic threshold gate using inverted logic.

FIG. 9 illustrates a two-of-three semi-dynamic threshold gate using inverted logic. The GTN pull-down network 104 consists of three NMOS transistors 108, 110, 112 connected in series between signal node 102 and ground. The GTD pull-up network 100 consists of three pair of PMOS transistors 114, 116, 118. Each pair is configured to form a series connection between VDD and the signal node 102. Gates of the first pair of PMOS transistors 114 connect to inputs A and B. Gates of the second pair of PMOS transistors 116 connect to inputs B and C. Gates of the third pair of PMOS transistors 118 connect to inputs A and C. The inputs are assigned to the transistors in the GTD pull-up network in order to minimize undesirable charge sharing effects. Additional reduction of charge sharing effects can be achieved by implementing the circuit using minimum-sized shared diffusion regions between adjacent transistors within each series chain in the pull-up and pull-down networks.

Inverted logic configurations provide an advantage over non-inverted logic configurations in that discrepancies between the delays associated with GTN network 104 and the GTD network 100 can be more easily balanced. For threshold m-of-n gates where m is less than n, the GTN network has a longer chain of transistors connected in series than does the GTD network. In non-inverted logic gates, the GTN network is a pull-up network comprising PMOS transistors placed in series, as shown, for example, in FIGS.

5 and 6. In non-inverted logic configurations, the longest series chain of transistors is made up of the slowest transistors, since circuit delay increases as the number of transistors in series increases, and hole mobility is substantially less than electron mobility. A chain of PMOS transistors in series will operate significantly slower than a corresponding series chain of NMOS transistors of similar widths. In contrast, in threshold gates using inverted logic, as for example in FIG. 9, the GTN network is a pull-down network comprising NMOS transistors, so that the longest series chain of transistors is made up of the faster NMOS transistors.

FIG. 10 illustrates a semi-dynamic two-of-four gate using inverted logic adapted for two mutually exclusive assertion groups each having two lines. The GTN pull-down network 104 comprises four NMOS transistors 120, 122, 124, 126 connected in series between signal node 102 and ground. The gates of the four NMOS transistors 120, 122, 124, 126 each connect to one of the four inputs A, B, C, D. The GTD pull-up network 100 comprises two pairs of PMOS transistors. The first pair of PMOS transistors 128, 130 connect in parallel between VDD and an internal signal node 131. The second pair of PMOS transistors 132, 134 connect in parallel between the internal node 131 and the signal node 102. Gates of the first pair of PMOS transistors 128, 130 connect to inputs A and B. Gates of the second pair of PMOS transistors 132, 134 connect to inputs C and D.

In this example, signal lines A and B form a first mutually exclusive assertion group, and signal lines C and D form a second mutually exclusive assertion group. Only one of signal lines A and B will be ASSERTED (low) at a time, and only one of input signal lines C and D will be ASSERTED (low) at time. When a signal line from the first mutually exclusive assertion group and a signal line from the second mutually exclusive assertion group are ASSERTED (low), corresponding transistors of the GTD pull-up network 100 form a conduction path pulling the voltage of signal node 102 to VDD, and the inverter 106 produces an ASSERTED (low) voltage signal at the output Z. When all inputs A, B, C, D are NULL (high), the GTN pull-down network 104 pulls the voltage of signal node 102 to ground, and the inverter 106 produces a NULL (high) voltage signal at the output Z.

When precisely one of the inputs A, B, C, D is ASSERTED (low), the GTD and GTN networks 100, 104 are off, and the weak PMOS transistor 108 determines the voltage at the signal node 102. If the output Z was previously ASSERTED (low), the weak PMOS transistor 102 will be ON and hold the signal node 102 at a high voltage. The inverter 106 will hold the output at ASSERTED (low). If the output Z was previously high, the weak PMOS transistor 106 will be OFF. The signal node 102 will be isolated, and will retain its previous low state, which holds the output NULL (high). Thus, the gate will: (1) switch the output to NULL (high) when all inputs are NULL (high); (2) switch the output to ASSERTED (low) when at least one signal line from each mutually exclusive assertion group is ASSERTED (low); and (3) hold the output in a prior NULL or ASSERTED state when one input is ASSERTED.

Dynamic Threshold Gates

In the semi-dynamic NULL convention threshold gates shown in FIG. 4, a weak PMOS transistor 69 determines the voltage level at signal node 63 (and hence the value at the output Z) during periods when the GTN pull-up network 61 and the GTD pull-down network 65 are both off. The voltage level at node 63 (FIG. 4) will be maintained as long as the power supply voltage is maintained, regardless of the time elapsed between the arrival of successive NULL and Data wavefronts. Thus, with semi-dynamic threshold gates, if output Z is zero, then transistor 69 is ON, and node 63 is held at VDD. Otherwise, if output Z is high, the transistor 63 is OFF and node 63 is held at ground according to the operation of the GTD network 65. In FIG. 8, the weak PMOS transistor 108 shown performs a similar function.

In certain applications, it is contemplated that successive Data and NULL wavefronts will occur within some maximum time interval, e.g., on the order of a few milliseconds. In those cases, the dynamic charge storage at an isolated node 63 by itself will be enough to ensure that its voltage level will be sufficiently maintained during the time interval between successive wavefronts. During these limited time periods, any voltage changes that occur at node 63, if any, will be small compared to the voltage change needed for the inverter 67 to switch its output. In these situations, the transistor 69 becomes superfluous. By removing this transistor, a "dynamic" threshold gate is created.

FIG. 11 illustrates a block diagram for a dynamic NULL convention threshold gate. The gate of FIG. 11 is similar to that shown in FIG. 4, except that transistor 69 has been removed. The threshold gate includes: (i) a Go-to-NULL (GTN) pull-up network 200 comprising PMOS transistors that, when ON, establish a connection between VDD and signal node 202; (ii) a Go-to-data (GTD) pull-down network 204 comprising NMOS transistors that receive a plurality of inputs and, when ON, establish a connection between signal node 202 and ground; and (iii) a static CMOS inverter 206 that drives the output Z. The architecture shown in FIG. 11 assumes a non-inverted signal expression, ASSERTED is assigned to the VDD voltage level, while NULL is assigned to the ground voltage level. It will be appreciated that the architecture can be modified for inverted signal expression in a manner similar to modifications discussed above with respect to semi-dynamic gate designs.

In operation, when all of the input signals go low (NULL), the GTN pull-up network 200 turns ON, and the GTD pull-down network 204 is OFF. Node 202 is pulled to VDD, and output Z goes low (NULL). If one or more of the input signals go high (ASSERTED) but the threshold condition has not been met, then both the GTN pull-up network 200 and the GTD pull-down network 204 are OFF. Node 202 becomes isolated but remains high because of charge storage, and output Z remains low (NULL). When enough input signals have gone high (ASSERTED) so that the threshold condition is met, the GTD pull-down network 204 turns ON while the GTN pull-up network 200 remains OFF. Node 202 is pulled to ground, and output Z goes high (ASSERTED). When some, but less than all of the input signals go low (NULL), both the GTN pull-up network 200 and the GTD pull-down network 204 are OFF. Isolated node 202 remains at ground, and output Z stays high (ASSERTED). Finally, when all of the input signals return low (NULL), the GTN pull-up network 200 turns ON and the GTD pull-down network 204 is OFF. Node 202 is pulled to VDD, and output Z goes low (NULL).

FIG. 12 shows a schematic diagram of a dynamic two-of-two threshold gate, illustrating the arrangement of NMOS and PMOS transistors within the GTN pull-up network 200 and the GTD pull-down network 204. The GTN pull-up network 200 includes a pair of PMOS transistors 208, 210 connected in series between VDD and a signal node 202. The PMOS transistors 208, 210 each receive one of the input signals A, B. The GTD pull-down network 204 includes a pair of NMOS transistors 212, 214 connected in series between the signal node 202 and ground. The NMOS transistors 212, 214 each receive one of the input signals A, B. These networks are architecturally identical to the GTN network 61 and GTD network 65 of FIG. 5, and the gate of FIG. 12 will exhibit the same switching function as the gate of FIG. 5.

FIG. 13 illustrates a dynamic two-of-three threshold gate. The GTN pull-up network 200 comprises three PMOS transistors 220, 222, 224 connected in series between VDD and the signal node 202. The GTD pull-down network 204 comprises three pair of NMOS transistors 226, 228, 230, 232, 234, 236, with two transistors of each pair connected in series between the signal node 202 and ground. The GTN pull-up network 200 and GTD pull-down network 204 are architecturally identical to the GTN pull-up network 61 and GTD pull-down network 65 respectively of FIG. 6, and the gate of FIG. 13 will exhibit the same switching characteristic as the gate of FIG. 6. The inputs to the GTD pull-down network 204 are assigned in order to minimize undesirable charge sharing effects. These effects can be minimized further by implementing the circuit using minimum-sized shared diffusion regions between adjacent transistors within each series chain of transistors in the pull-up and pull-down networks.

Figure 14:
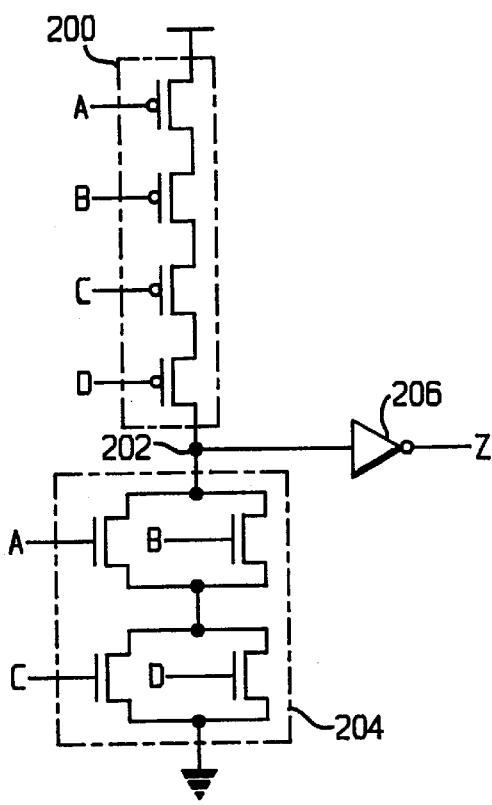
FIG. 14 illustrates a design for a dynamic two-of-four gate adapted for two mutually exclusive assertion groups.

FIG. 14 illustrates a design for a dynamic two-of-four gate adapted for two mutually exclusive assertion groups of two signal lines each. The gate includes a GTN pull-up network 200 having four PMOS transistors arranged identically to the GTN pull-up network 61 of FIG. 7. The gate also includes a GTD pull-down network having four NMOS transistors arranged identically to the GTN Pull-Down Network 65 of FIG. 7. An inverter 206 generates the gate output Z according to the voltage on node 202.

It will be appreciated that changing the GTD pull-down network 204 and GTN pull-up network 200 will permit implementation of threshold gates having varying numbers of inputs and threshold values. The networks can be further adapted for use with varying numbers of mutually exclusive assertion groups, for mutually exclusive assertion groups having varying numbers of signal lines, and for use with inverted signal expressions (e.g., ASSERTED represented as ground voltage).

In certain applications which use dynamic threshold gates, alternating stages of inverted and non-inverted logic may be used. The alternating stages are connected by omitting what would otherwise be the inverters 67 (FIG. 4), 106 (FIG. 8), 206 (FIG. 12) that drive the outputs of threshold gates. Greater speed can be achieved by eliminating the propagation delays associated with the inverters.

One suitable application for alternating inverted/non-inverted logic is a tree-type completion detector. A completion detector senses a number of signals (some of which might be mutually exclusive assertion groups) and generates an ASSERTED output when a complete set (threshold number) of signal lines is ASSERTED. The completion detector generates a NULL output when all signal lines are NULL. When less than a complete set of signal lines is ASSERTED, the completion detector will hold its prior ASSERTED or NULL state.

Figure 15A:
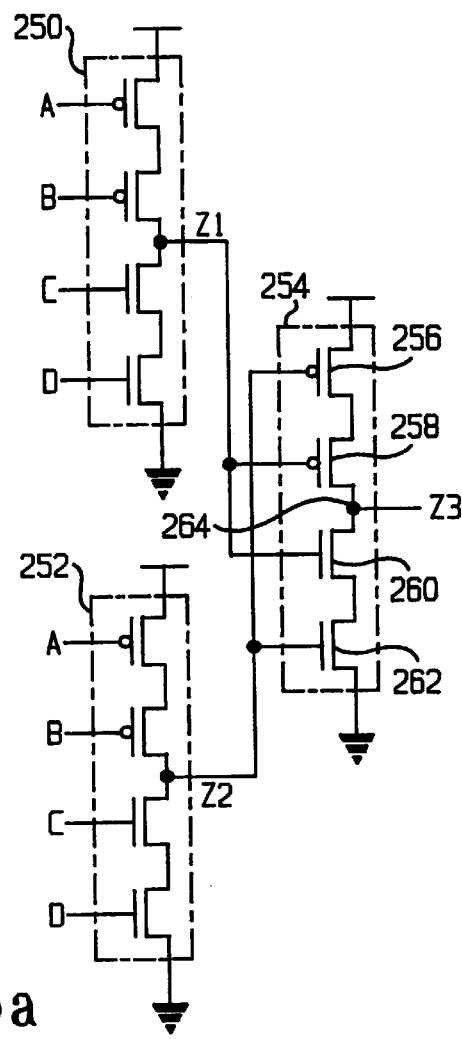
FIG. 15a illustrates a 4-input completion detector constructed as a two-level binary tree of two-of-two threshold gates in an alternating logic arrangement.

FIG. 15a illustrates a 4-input completion detector constructed as a two-level binary tree of two-of-two threshold gates in an alternating logic arrangement. The output Z3 will become ASSERTED when all four of the inputs A, B, C, D are ASSERTED.

The first two-of-two gate 250 is configured substantially identically to the gate of FIG. 12, but without output inverter 206. The first 2-of-2 gate 250 receives inputs A, B and generates an intermediate output Z1. The output Z1 is low (ASSERTED) when inputs A and B are high (ASSERTED). ASSERTED corresponds to the ground voltage level for signal Z1. The output Z1 is high (NULL) when inputs A and B are low (NULL). NULL corresponds to a high voltage level for signal Z1. When one of the two inputs is ASSERTED while the other is NULL, the output Z1 holds its prior state.

The second 2-of-2 gate 252 is configured substantially identically to the first 2-of-2 gate. It receives inputs C, D, and generates an intermediate signal Z2. The switching characteristic is analogous to that of the first 2-of-2 gate 250.

The inputs to the first and second 2-of-2 gates 250, 252 are non-inverted, in the sense that a high level input on lines A, B, C, or D represents an ASSERTED state. From the standpoint of logical significance, the intermediate outputs Z1, Z2 are inverted. The intermediate outputs Z1, Z2 are ASSERTED when the inputs are ASSERTED. However, a low voltage level signifies the ASSERTED states of the intermediate outputs Z1, Z2.

The completion detector output is driven by a third 2-of-2 gate 254. The third 2-of-2 gate 254 is inverted in the sense that a PMOS transistor network 256, 258 pulls a signal node 264 to VDD when inputs Z1, Z2 are ASSERTED, while an NMOS transistor network 260, 262 pull the signal node 264 to ground when inputs Z1, Z2 are NULL. The final output line Z3 thus is pulled to VDD (ASSERTED) when all inputs A, B, C, D, are high (ASSERTED), and pulls the output signal line Z3 low (NULL) when all inputs A, B, C, D are low (NULL). When some input signal lines are ASSERTED and others NULL, the gate output Z3 will hold its prior output.

Figure 15B:
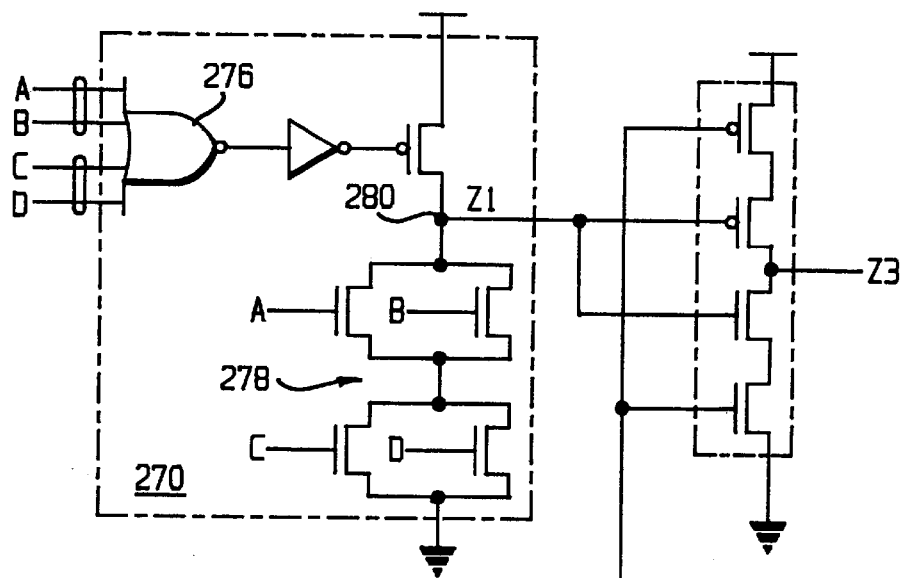
FIG. 15b illustrates another circuit using alternating non-inverted/inverted logic.
Figure 15B:
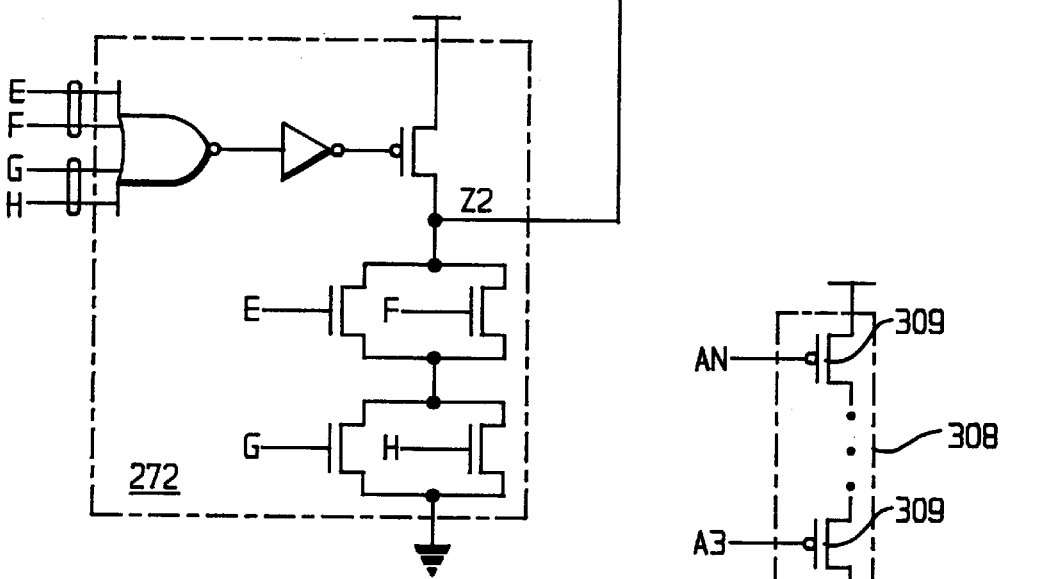

FIG. 15b illustrates another circuit using alternating non-inverted/inverted logic. The gate of FIG. 15b monitors four pairs of inputs, each of which is a mutually exclusive assertion group of two lines. The gate generates an ASSERTED output when one signal line of each of the four pair is ASSERTED. Input lines are ASSERTED when high, and the output line is ASSERTED when high. Internally, however, the signal assignment is reversed.

The gate is arranged in two stages. The first stage includes two identical 2-of-4 gates 270, 272, each adapted to monitor four input signal lines. The first 2-of-4 gate 270 monitors a first mutually exclusive assertion group formed by lines A and B, and a second mutually exclusive assertion group formed by lines C and D. The second two-of-four gate 272 monitors third and fourth mutually exclusive assertion groups formed by lines E, F and G, H. Each gate 270, 272 of the first stage has an overall switching characteristic identical to the two-of-four gate of FIG. 14, except that the outputs Z1, Z2 are considered ASSERTED when low, because the gates of the first stage 270, 272 lack inverting output drivers.

The first two-of-four gate 270 has a signal node 280, a GTN pull-up circuit 276 and a GTD pull-down circuit 278. The GTD pull-down circuit 278 is identical to the pull-down circuit 204 of FIG. 14. The GTN pull-up network has been modified according to the pull-up structure discussed in detail below with reference to FIG. 17, and has a switching characteristic that pulls the signal node 280 to VDD when all inputs are NULL (low). The second 2-of-4 gate 272 is identical to the first, except that it monitors different input signal lines.

The second stage 274 is identical to the second stage 254 of FIG. 15a. The Z1 output from the first stage will be ASSERTED (low) when one line from each of the first and second mutually exclusive assertion groups A, B, C, D is asserted. The Z2 output from the first stage will be ASSERTED (low) when one line from each of the third and fourth mutually exclusive assertion groups E, F, G, H is asserted. None of the outputs Z1, Z2, Z3 will switch until a complete set of inputs has been presented to their respective gates.

As will be apparent to those in the art, the arrangements shown in FIGS. 15a and 15b could be reversed, so that the first level of logic uses inverted logic while the second uses non-inverted logic. Circuits having greater numbers of stages, or differing numbers of inputs could also be constructed using combined alternating inverted and non-inverted logic circuits. Furthermore, complex gates can be derived by varying the switching characteristics of the first and second stages. All would share a common characteristic that: 1) the output stage only switches to an ASSERTED when a complete set of inputs is ASSERTED (and the complete set may be less than the total number of inputs), 2) the output stage switches to NULL when all inputs are NULL; and 3) output does not switch its output to ASSERTED or NULL until a complete set (NULL or ASSERTED) of inputs is received.

Modified Pull-Up Structure

Figure 16:
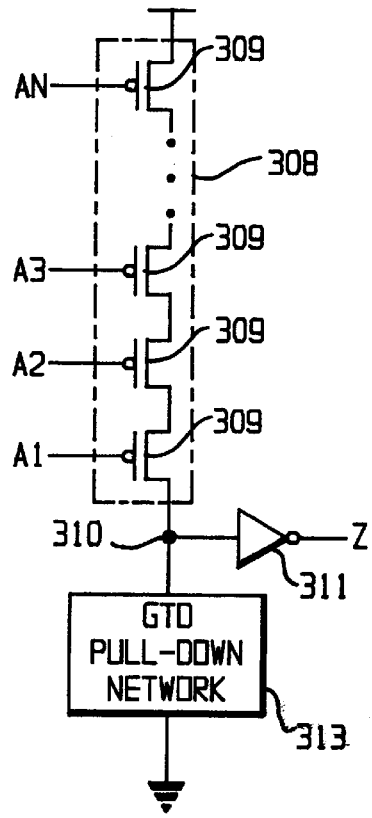
FIG. 16 shows a general configuration of an m-of-n dynamic threshold gate with a series-type GTN pull-up network.

In the semi-dynamic and dynamic threshold gates described above, the GTN pull-up (for non-inverted) and pull-down (for inverted) networks generally comprise NMOS or PMOS transistors. FIG. 16 shows a general configuration of an m-of-n dynamic threshold gate with a series-type GTN network. As shown, the GTN pull-up network 308 comprises a number N of PMOS transistors 309 connected in series between VDD and a signal node 310. As with the gate designs of FIGS. 4 and 11, the configuration includes an inverter 311 that drives the output according to the voltage at signal node 310, and a GTD pull-down network that, when ON, connects the signal node 310 to ground.

The series configuration of transistors presents two optimization challenges. First, the pull-up to VDD through these transistors with be slow, particularly for large values of N. Second, charge sharing may occur between the intermediate nodes between transistors in the series chain and node 310. Design changes within this architecture tend to be trade-offs between these two characteristics. If speed is increased by, e.g., using wider transistors or by using trapezoidal scaling of the widths, the charge sharing problem is exacerbated. On the other hand, operating speed might decrease if charge sharing is reduced by, e.g., decreasing the transistor width. A GTN pull-up network for this type of series configuration therefore is sub-optimal for large values of N.

Figure 17:
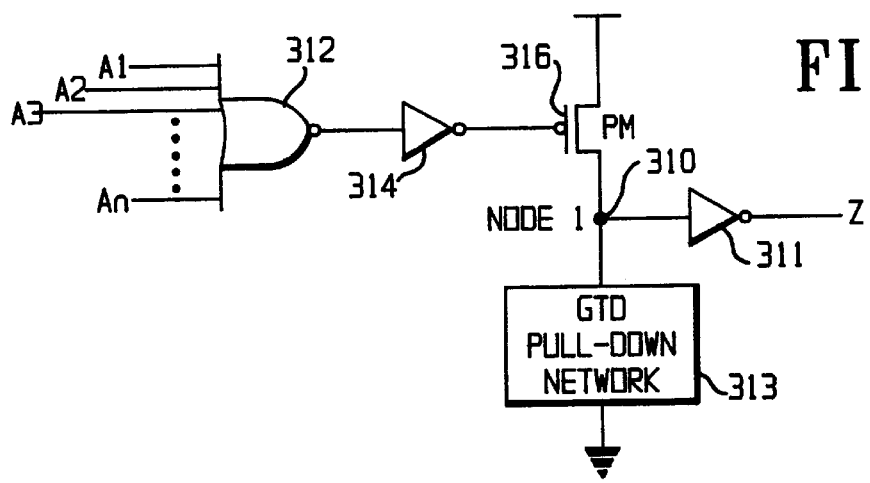
FIG. 17 illustrates a first modified GTN network.

FIG. 17 illustrates a first modified GTN pull-up network which ameliorates the charge sharing problem without adversely affecting operating speed. The pull-up network comprises an N-input static CMOS NOR gate 312, a static CMOS inverter 314, and a single PMOS pull-up transistor 316. The NOR gate 312 receives the N inputs A1, . . . , AN and generates a high signal when all inputs are low. The inverter 313 inverts the output of the NOR gate 312 and drives the gate input of PMOS transistor 316. The PMOS transistor 316 pulls the signal node 310 to VDD when all inputs A1, . . . , AN are low. The configuration of FIG. 17 can be modified for differing numbers of inputs, or to be a pull-down network for inverted logic if desired.

The configuration of FIG. 17 eliminates charge sharing relative to the configuration of FIG. 16 that would otherwise occur at nodes between series transistors 309 by eliminating nodes in the series pull-up path. Any charge sharing that might occur internally within the CMOS NOR gate associated with chains internal to the PMOS transistor can be reduced by sizing the transistors within the gate. The speed of the network can be further improved by widening the single PMOS pull-up transistor 316. Thus, the architecture of FIG. 17 permits improvement in both speed and charge sharing characteristics.

Figure 18:
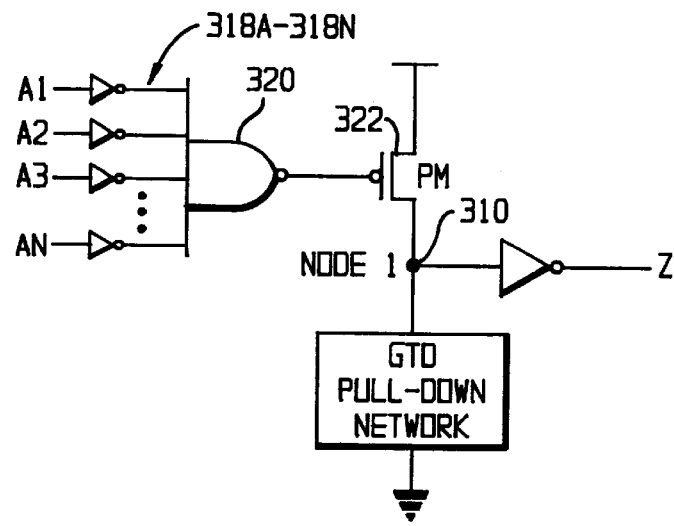
FIG. 18 illustrates an alternate, modified GTN network.

FIG. 18 illustrates an alternate, modified GTN pull-up network which also ameliorates the charge sharing problem associated with the configuration of FIG. 16 without adversely affecting operating speed. As shown in FIG. 18, the pull-up network comprises an N-input static CMOS NAND gate 320 with a plurality of CMOS inverters 318A–318N connecting input signals to inputs of the NAND gate 320. The output of the NAND gate 320 goes low when all inputs A1, . . . , AN are low. The NAND gate output drives the gate of a single PMOS pull-up transistor 322 which, when on, pulls node 310 to VDD. Thus, the pull up network of configuration of FIG. 18 drives the output Z to NULL when all inputs are NULL. It will be appreciated that the configuration of FIG. 18 can be modified for varying numbers of inputs, or (if desired) to be a pull-down network for inverted logic.

By using a static CMOS NAND gate as in FIG. 18, the series PMOS transistor chain 308 of FIG. 16 is replaced with a series NMOS transistor chain located internally within the NAND gate. The circuit operates much faster, because electron mobility is much higher than hole mobility. A series chain of NMOS transistors therefore operates much faster than a series chain of PMOS transistors of equal widths. Both of the alternative pull-up gate designs illustrated in FIGS. 17 and 18 may be used in static, semi-static, semi-dynamic and dynamic threshold gate designs. It will be appreciated that other circuits could be substituted to drive a single pull-up transistor.

In both of the modified pull-up networks shown in FIGS. 17 and 18, the finite propagation delay through the static CMOS logic that drives the pull-up transistor 316 and 322 does not adversely affect a smooth switching characteristic of the threshold gate output. When all inputs are low, transistor 316 or 322 is ON, and the pull-down network is OFF. In the worst case, if all inputs A1, . . . , AN simultaneously become high, the GTD pull-down network would turn ON before the pull-up network has time to switch. The pull-up transistor 316 or 322 would remain ON until the new input values propagated through the static CMOS logic of the pull-up network. Two paths would simultaneously exist: one pulling signal node 310 to VDD, the other pulling signal node 310 to ground. The two paths would reduce the voltage at node 310 to some intermediate value between VDD and ground. Subsequently, when the input signal values Al, . . . , AN propagate through the static logic, the pull-up transistor 316 or 322 would turn OFF, and the voltage at node 310 would fall to ground. A single, smooth transition would still take place without any period during which the voltage at node 310 swings back and forth across the switching voltage of output inverter 311.

When the next NULL wavefront arrives, the GTD pull-down network would turn OFF before the transistor 316 or 322 was able to turn ON. In the case of a dynamic or semi-dynamic gate, node 310 would remain floating at ground. If the modified pull-up structures were used with a semi-static gate configuration utilizing additional transistors, as described in, e.g., FIG. 17b of U.S. Pat. No. 5,656,948, the additional weak NMOS pull-down feedback transistor will continue to drive the signal node to ground. Thus, with either a dynamic, semi-dynamic, or semi-static gate design, the propagation delay of the modified pull-up structure will not adversely affect a smooth switching characteristic.

Figure 19:
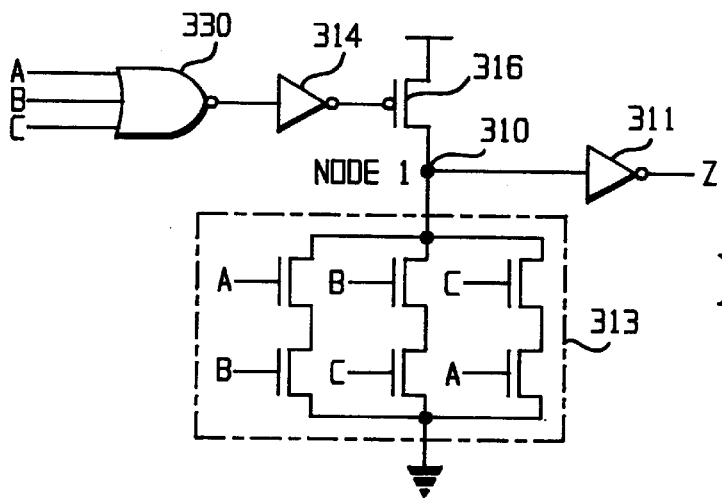
FIG. 19 illustrates a dynamic two-of-three threshold gate using the modified network design of FIG. 17.

FIG. 19 illustrates a dynamic 2-of-3 threshold gate using the modified pull-up network design of FIG. 17. It is similar to the 2-of-3 gate of FIG. 13, except that the series pull-up transistors 220, 222, 224 of FIG. 13 have been replaced by a three-input NOR gate 330, a pull-up network inverter 314, and a PMOS pull-up transistor 316. The NOR gate 330 receives the three inputs A, B, C and generates a high signal when all inputs are low. The pull-up network inverter 314 inverts the output of the NOR gate 330 and drives the gate input of PMOS pull-up transistor 316. The PMOS pull-up transistor 316 pulls the signal node 310 to VDD when all inputs are low. An inverting output driver 311 drives the output Z according to the voltage at signal node 310. A GTD pull-down network 313 is functionally the same as the pull-down network 204 of FIG. 13.

Figure 20:
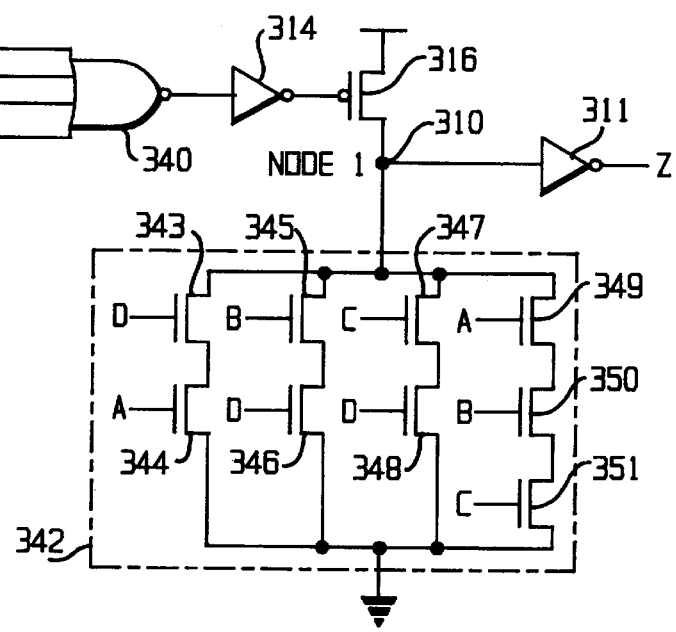
FIG. 20 illustrates a variation on a dynamic three-of-five threshold gate using the GTN network of FIG. 17.

FIG. 20 illustrates a variation on a dynamic three-of-five threshold gate using the modified pull-up network design of FIG. 17. This gate has four inputs A, B, C, D with one input (D) having a weight of two. The gate threshold is taken as three, but input D is given a weight of two so that assertion of a combination of D and any one of the other three inputs A, B, C provides a total count of three. That is, the gate output will become ASSERTED when: (i) inputs A, B, and C are ASSERTED, or (ii) input D is ASSERTED with any one of inputs A, B, and C. A threshold gate having an input with a weight of two can be used in certain structures, such as the full adder circuit illustrated in copending U.S. patent application Ser. No. 08/483,557, "Null Convention Adder," by D. Duncan et. al., the entire contents of which are incorporated herein by reference.

The gate of FIG. 20 is similar to the gate of FIG. 19, except that the three-input NOR gate 330 of FIG. 19 has been replaced by a four-input NOR gate 340 in FIG. 20, and the GTD pull-down network 313 of FIG. 19 has been replaced by the GTD pull-down network 342 of FIG. 20. The pull-up network of FIG. 20 includes a pull-up inverter 314 and PMOS pull-up transistor 316 that operate together as the pull-up network of FIG. 17.

The GTD pull-down network 342 includes four sets of NMOS transistors, each forming a series chain between signal node 310 and ground. The first chain includes two transistors 343, 344 with gates receiving inputs D and A respectively. The second chain includes two transistors 345, 346 with gates receiving inputs B and D respectively. The third chain includes two transistors 347, 348 with gates receiving inputs C and D respectively. The fourth chain includes three transistors 349, 350, 351 with gates receiving inputs A, B and C respectively.

When ON, PMOS transistor 316 pulls signal node 310 to VDD, thereby causing inverting driver 311 to drive the output low. When all four inputs A, B, C, D low (NULL), the output of CMOS NOR gate 340 is high, which causes pull-up inverter 314 to turn PMOS transistor 316 ON. Pull down network 342 provides a switching characteristic that pulls signal node 310 to ground (and thus to drive the output high) when any of the switching criteria is met.

The examples of FIGS. 19 and 20 illustrated modified pull-up structures using the static CMOS NOR/inverter configuration of FIG. 19. Gates can be made to accommodate varying numbers of inputs and thresholds by varying the numbers of inputs to the NAND or NOR gate of the GTN circuit, and by varying transistor configuration in the GTD network. Furthermore, GTD networks can be modified to accommodate differing weights for inputs, and to accommodate signal lines configured as mutually exclusive assertion groups. In addition, variations can be made to accommodate inverted or non-inverted signal expression by replacing PMOS with NMOS devices (and vice versa), and by replacing VDD and ground connections.

It will also be readily apparent that a variety of gates can be implemented to accommodate differing combinations of aspects of gates described herein, such as inverted/non-inverted signal expression, varying numbers of inputs and thresholds, dynamic and semi-dynamic configurations, and mutually exclusive assertion groups. Although the present invention has been described with reference to the illustrative preferred embodiments, various modifications will be readily apparent to those in the art which fall within the spirit and scope of the present invention. The embodiments described herein are exemplary and not intended to limit the scope of the invention as defined by the appended claims.

What is claimed is:

1. A semi-dynamic, m-of-n threshold gate with hysteresis comprising:

a signal node;

a GTN circuit driving the signal node to a first predetermined voltage when all of a plurality of threshold gate input signal lines are in a NULL state;

a GTD circuit driving the signal node to a second predetermined voltage when at least a threshold number of threshold gate input signal lines is in an ASSERTED state said threshold number being less than the total number of input signal lines;

an output circuit driving a threshold gate output signal line to NULL and ASSERTED states in response to voltage states of the signal node; and a feedback circuit driving the signal node to a predetermined voltage state in response to the state of the threshold gate output signal line so as to hold the threshold gate output signal in a prior NULL or ASSERTED state when at least one, but less than the threshold number, of threshold gate input signal lines is in the ASSERTED state, wherein the GTN network comprises:

a switching circuit generating a switching signal in response to a plurality of input signals derived from threshold gate input signals; and a switching transistor driving the signal node to a voltage reference in response to the switching signal.

2. The gate of claim 1 wherein the switching circuit includes a NOR gate generating a NOR signal in response to a plurality of input signals derived from threshold gate input signals.

3. The gate of claim 1 wherein the switching circuit includes a NAND gate generating a NAND signal in response to a plurality of input signals derived from threshold gate input signals.

4. A dynamic m-of-n threshold gate with hysteresis comprising:

a signal node;

a GTN circuit driving the signal node to a first predetermined voltage when all of a plurality of input signal lines are in the NULL state, wherein the GTN circuit comprises:

(a) a switching circuit generating a switching signal in response to a plurality of input signals derived from threshold gate input signals; and (b) a switching transistor driving the signal node to a voltage reference in response to the switching signal;

a GTD circuit driving the signal node to a second predetermined voltage when at least a threshold number of input signal lines is in an ASSERTED state, said threshold number being less than the total number of input signal lines; and an output circuit driving an output signal line to NULL and ASSERTED states in response to voltage states of the signal node;

wherein said signal node is isolated from voltage references when at least one, but less than the threshold number of inputs is in the ASSERTED state, and said isolated signal node holds sufficient charge to signal the output circuit to maintain the gate output signal line in a previously existing ASSERTED or NULL state for a predetermined period of time.

5. The gate of claim 4 wherein the switching circuit includes a NOR gate generating a NOR signal in response to a plurality of input signals derived from threshold gate input signals.

6. The gate of claim 4 wherein the switching circuit includes a NAND gate generating a NAND signal in response to a plurality of input signals derived from threshold gate input signals.

7. An m-of-n threshold gate with a modified pull-up structure comprising:

a signal node;

an output circuit driving an output signal line to NULL and ASSERTED states in response to voltage states of the signal node;

a GTD circuit driving the signal node to a second predetermined voltage when at least a threshold number of input signal lines is in an ASSERTED state, said threshold number being less than the total number of input signal lines; and a GTN circuit driving the signal node to a first predetermined voltage when all of a plurality of input signal lines are in the NULL state;

wherein said GTN circuit includes (a) a switching circuit generating a switching signal in response to a plurality of input signals derived from threshold gate input signals, and (b) a switching transistor driving the signal node to a voltage reference in response to the switching signal.

8. The gate of claim 7 wherein the switching circuit includes a NOR gate generating a NOR signal in response to a plurality of input signals derived from threshold gate input signals.

9. The gate of claim 7 wherein the switching circuit includes a NAND gate generating a NAND signal in response to a plurality of input signals derived from threshold gate input signals.

10. The gate of claim 7 wherein:

the ASSERTED state of the threshold gate output signal line is the voltage level of a voltage reference relative to a ground level; and the NULL state of the threshold gate output signal line is the ground level.

11. The gate of claim 7 wherein:

the NULL state of the threshold gate output signal line is the voltage level of a voltage reference relative to a ground level; and the ASSERTED state of the threshold gate output signal line is the ground level.

12. The gate of claim 7 wherein the GTD network drives the signal node to the second predetermined level when precisely one of each of a plurality of groups of threshold gate input signal lines is in the ASSERTED state.

13. An electronic circuit having alternating inverted and non-inverted stages for processing logic signals, said logic signals having an ASSERTED state with logical meaning and a NULL state that has no logical meaning, said circuit comprising:

a first stage having a first threshold circuit, said first threshold circuit receiving inputs having an ASSERTED state represented as a first parametric level and a NULL state represented as a second parametric level, said threshold circuit generating an output having an ASSERTED state represented by the second parametric level and a NULL state represented by the first parametric level;

a second stage having a second threshold circuit, said second threshold circuit receiving an input from said first threshold circuit, said second threshold circuit generating an output signal having an ASSERTED state represented by said first voltage level and a NULL state represented by said second voltage level.

14. The circuit of claim 13 wherein the first threshold circuit receives inputs having the ASSERTED state represented by a reference voltage level and the NULL state represented by a ground voltage level.

15. The circuit of claim 13 wherein the first threshold circuit receives inputs having the NULL state represented by a reference voltage level and the ASSERTED state represented by a ground voltage level.

16. The circuit of claim 13 wherein:

the second stage generates an ASSERTED output when a threshold number of inputs is in the ASSERTED state;

the second stage generates a NULL output when all inputs are in the NULL state; and the second stage maintains a previously-existing ASSERTED or NULL output when a number of inputs in the ASSERTED state is greater than zero and less than the threshold number.

\* \* \* \* \*